(12) United States Patent
Padmaraju et al.

(10) Patent No.: US 10,281,747 B2
(45) Date of Patent: May 7, 2019

(54) APPLICATIONS OF WAVELENGTH-LOCKING USING DITHERING SIGNALS FOR MICRORING RESONATORS

(71) Applicant: THE TRUSTEES OF COLUMBIA UNIVERSITY IN THE CITY OF NEW YORK, New York, NY (US)

(72) Inventors: Kishore Padmaraju, Endwell, NY (US); Keren Bergman, Princeton, NJ (US)

(73) Assignee: THE TRUSTEES OF COLUMBIA UNIVERSITY IN THE CITY OF NEW YORK, New York, NY (US)

(*) Notice: Subject to any disclaimer, the term of this patent is extended or adjusted under 35 U.S.C. 154(b) by 656 days.

(21) Appl. No.: 14/800,799

(22) Filed: Jul. 16, 2015

(65) Prior Publication Data

US 2015/0323818 A1 Nov. 12, 2015

Related U.S. Application Data

(63) Continuation of application No. PCT/US2014/012753, filed on Jan. 23, 2014.
(Continued)

(51) Int. Cl.
*H04B 7/0456* (2017.01)
*H04B 10/50* (2013.01)
(Continued)

(52) U.S. Cl.
CPC .......... *G02F 1/0147* (2013.01); *G02F 1/0121* (2013.01); *G02F 1/3132* (2013.01); *H01S 3/0085* (2013.01); *H01S 5/0687* (2013.01); *H01S 5/06832* (2013.01); *H01S 5/1032* (2013.01); *H01S 5/142* (2013.01);
(Continued)

(58) Field of Classification Search
CPC .... G02F 1/0147; G02F 1/3132; G02F 1/0121; G02F 2201/58; H01S 3/0085; H01S 5/142; H01S 5/1032; H01S 5/06832; H01S 5/0687; H01S 5/06837; H01S 5/042; H04B 7/0456; H04B 10/5057; H04B 10/501; H04B 10/572; H04B 7/0695;
(Continued)

(56) References Cited

U.S. PATENT DOCUMENTS 4,530,603 A 7/1985 Shaw et al.
4,686,407 A 8/1987 Ceperley
(Continued)

OTHER PUBLICATIONS

De Vos et al., "Silicon-on-Insulator microring resonator for sensitive and label-free biosensing," 15(12):7610-7615 (2007).
(Continued)

*Primary Examiner* — Leslie C Pascal
(74) *Attorney, Agent, or Firm* — Baker Botts L.L.P.

(57) ABSTRACT

A low-cost, robust method for automatically tuning a coupled resonator to match a wavelength of electromagnetic radiation emitted from an applied laser source. Dithering signals are used for automatic wavelength tuning and thermal stabilization of microring resonators. The disclosed method can be applied using low-speed analog and digital circuitry, to create a complete photonic interconnection network. The methods disclosed also automatically detect, measure, and correct for resonance shift.

28 Claims, 12 Drawing Sheets

Related U.S. Application Data

(60) Provisional application No. 61/756,932, filed on Jan. 25, 2013, provisional application No. 61/830,458, filed on Jun. 3, 2013, provisional application No. 61/838,065, filed on Jun. 21, 2013, provisional application No. 61/838,107, filed on Jun. 21, 2013.

(51) Int. Cl.

| | |
|---|---|
| *H04B 10/572* | (2013.01) |
| *H04B 7/06* | (2006.01) |
| *H04B 7/0452* | (2017.01) |
| *H04B 7/0426* | (2017.01) |
| *H04W 16/28* | (2009.01) |
| *H04W 28/18* | (2009.01) |
| *H04W 72/04* | (2009.01) |
| *G02F 1/01* | (2006.01) |
| *H01S 3/00* | (2006.01) |
| *H01S 5/0683* | (2006.01) |
| *H01S 5/0687* | (2006.01) |
| *H01S 5/10* | (2006.01) |
| *H01S 5/14* | (2006.01) |
| *G02F 1/313* | (2006.01) |
| *H01S 5/042* | (2006.01) |

(52) U.S. Cl.
CPC .......... *G02F 2201/58* (2013.01); *H01S 5/042* (2013.01); *H01S 5/06837* (2013.01)

(58) Field of Classification Search
CPC .... H04B 7/0639; H04B 7/0452; H04B 7/043; H04W 16/28; H04W 28/18; H04W 72/046
See application file for complete search history.

(56) References Cited

U.S. PATENT DOCUMENTS

| | | | |
|---|---|---|---|
| 4,893,353 A | 1/1990 | Iwaoka et al. | |
| 5,513,196 A | 4/1996 | Bischel et al. | |
| 6,580,532 B1 | 6/2003 | Yao et al. | |
| 7,460,573 B2 * | 12/2008 | Ooshima | H01S 5/0687 372/32 |
| 8,164,816 B1 | 4/2012 | Savchenkov et al. | |
| 8,340,517 B2 | 12/2012 | Shacham et al. | |
| 9,924,247 B2 * | 3/2018 | Hochberg | H04Q 11/0005 |
| 2003/0002099 A1 * | 1/2003 | Sayyah | H04B 10/25752 398/79 |
| 2003/0152313 A1 | 8/2003 | Tapalian et al. | |
| 2005/0163171 A1 | 7/2005 | Ng et al. | |
| 2006/0013530 A1 | 1/2006 | Shibata | |
| 2010/0200733 A1 | 8/2010 | McLaren et al. | |
| 2012/0156802 A1 | 6/2012 | Flagan et al. | |

OTHER PUBLICATIONS

DeRose et al., "Silicon Microring Modulator with Integrated Heater and Temperature Sensor for Thermal Control," OSA/CLEO, San Jose (2010).

International Search Report and Written Opinion dated Jul. 28, 2014 in International Application No. PCT/US14/12753.

Krishnamoorthy et al., "Computer Systems Based on Silicon Photonic Interconnects," Proc. IEEE 97(7):1337-1361 (2009).

Logan et al., "Monitoring and Tuning Micro-Ring Properties Using Defect-Enhanced Silicon Photodiodes at 1550 nm," IEEE Photon. Technol. Lett. 24(4):261-263 (2012).

Padmaraju et al., "Dynamic Stabilization of a Microring Modulator Under Thermal Perterbation," OFC/NFOEC Technical Digest, OSA (2012).

Padmaraju et al., "Thermal Stabilization of a microring modulator using feedback control," Opt. Express 20(27):27999-28008 (2012).

Qiu et al., "Wavelength tracking with thermally controlled silicon resonators," Opt. Expr. 19(6):5143-5148 (2011).

Timurdogan et al., "Automated Wavelength Recovery for Microring Resonators," CLEO Technical Digest, OSA (2012), paper CM2M.1.

Watts et al., "Adiabatic Resonant Microrings (ARMs) with Directly Integrated Thermal Microphotonics," CLEO, Baltimore, (2009).

* cited by examiner

APPLICATIONS OF WAVELENGTH-LOCKING USING DITHERING SIGNALS FOR MICRORING RESONATORS

CROSS REFERENCES TO RELATED APPLICATIONS

This application is a continuation of International Patent Application Serial No. PCT/US2014/012753, filed Jan. 23, 2014, which claims priority to U.S. Provisional Patent Application No. 61/756,932, filed Jan. 25, 2013, Application No. 61/830,458, filed Jun. 3, 2013, Application No. 61/838,065, filed Jun. 21, 2013, and Application No. 61/838,107, filed Jun. 21, 2013, which are incorporated by reference herein in their entirety.

STATEMENT REGARDING FEDERALLY SPONSORED RESEARCH

This invention was made with government support under grant number ECCS-0903406 awarded by the National Science Foundation. The government has certain rights in the invention.

BACKGROUND

The need for additional bandwidth has prompted the replacement of traditional electronic links with optical links for applications as diverse as data centers, supercomputers, embedded computing processor-memory interconnects, and fiber-optic access networks. For applications such as these, the silicon photonics platform can deliver necessary bandwidth and, by leveraging its compatibility with complementary metal-oxide-semiconductor (CMOS) fabrication, an economy of scale. In particular, silicon microring resonator based devices exhibit high metrics on size density, energy-efficiency, and ease of wavelength-division-multiplexed (WDM) operation.

Microring sensors are optical resonators that utilize certain properties of light to provide a better, more effective sensor. With their small footprint, CMOS-compatible fabrication, and multiplexed operation, silicon microring resonators are ideal for use as measurement devices. Microring sensors' high-refractive index provides them with a high sensitivity to such environmental factors such as temperature, and they can be treated to be reactive to biological and chemical components, making them useful as small label-free biological/chemical sensors.

FIG. 1 illustrates a microring-based photonic network known in the art for transcribing electrical data signals into the optical domain, transmitting and routing them as necessary, and converting the optical signals back to the electrical domain at the termination of the link. The link includes a multi-wavelength laser source. These laser wavelengths are individually modulated by cascaded microring modulators in a multiplexed configuration. The entire set of signals can then be routed as necessary by microring-based switches. Finally, they can be received by a microring array that de-multiplexes the individual signals before receiving them on independent photodetectors.

The relatively high thermo-optic coefficient of silicon combined with the wavelength selectivity of microring resonators lends them susceptible to changes in temperature and laser wavelength. Additionally, fabrication tolerances can result in microring resonators that are initially offset from their designed operating wavelength. Integrated heaters can be used to tune and stabilize the microring resonance to the laser wavelength. However, for commercial implementations, an energy-efficient and scalable solution to lock and stabilize microring resonators is required.

The use of microrings in interconnects can present challenges due to the difficulty in wavelength-locking them to lasers. A routine procedure for using the microring resonator as a sensor is to probe the resonance shift of the resonator as it is exposed to the environment or sample, and measuring this resonance shift by conducting fast spectral scans with a tunable laser and photodiode, or a broadband source, monochromator, and photodiode. However, the use of costly, bulky, and sensitive equipment such as tunable lasers and monochromators can lead to reduced deployment of microring resonators.

Further, in order to probe the microring sensor, complex and costly spectral scanning equipment can be required. In addition, the spectral scanning equipment can be large and contain sensitive grating components that yield less than robust sensing. Information gathered from spectral scanning equipment can require post-processing, which in turn relies on an added layer of software.

Accordingly, a technique using simple electronics is needed to provide a low-cost and energy-efficient solution that can be scaled to the hundreds to thousands of microrings that would comprise either a future optical interconnect or a large-scale microring sensor array.

SUMMARY

The disclosed subject matter provides techniques for locking a microring resonance to a laser wavelength. The disclosed subject matter also provides techniques for wavelength locking and stabilizing a microring resonator.

In accordance with an exemplary embodiment of the disclosed subject matter, a microring resonator can be provided. The microring resonator can be, for example, a silicon microring. Microdisk and microsphere resonators can also be used.

In accordance with an exemplary embodiment of the disclosed subject matter, an optical signal can be applied to the microring resonator. The source of the optical signal can be a laser. A dithering signal can be applied to the microring resonator. The dithering signal can be produced by a variety of methods. For example, the dithering signal can be applied thermally by using an integrated heater. The heater can be a thin film titanium-based heater and can be separated from the microring by a layer of oxide. The thermal dithering system can be implemented using off-chip electronics.

In accordance with one embodiment of the disclosed subject matter, a small modulation can be applied to the local temperature of the microring. The application of the small modulation can result in a small modulation of the optical signal. The generated optical modulation can be in-phase or out of phase with the driving signal. The modulated optical signal can be mixed with the driving dithering signal. The mixed product can include a DC value. The mixed product can also include a second harmonic. The second harmonic can be filtered out to isolate the DC signal. The DC signal can be used as an error signal to break the symmetry of the microring resonator.

In accordance with another embodiment of the disclosed subject matter, the disclosed techniques can be scaled to cover multiple microrings.

In accordance with another embodiment of the disclosed subject matter, a microring can be used to create electronics products such as optical modulators, filters, switches, and detectors. Such electronics products can be used, for example, in wavelength-division-multiplexed (WDM) photonic links.

In accordance with another embodiment of the disclosed subject matter, a microring can be used as, or as part of a sensor. For example, the sensor can be used to detect a variety of biological molecules.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The accompanying drawings, which are incorporated and constitute part of this disclosure, illustrate some embodiments of the disclosed subject matter.

DETAILED DESCRIPTION

The disclosed subject matter is generally directed to a method of using a dithering signal for wavelength locking and stabilizing a microring resonator. A microring resonator is an optical device that blocks the transmission of light at optical wavelengths that meet its resonance requirement.

Figure 1:
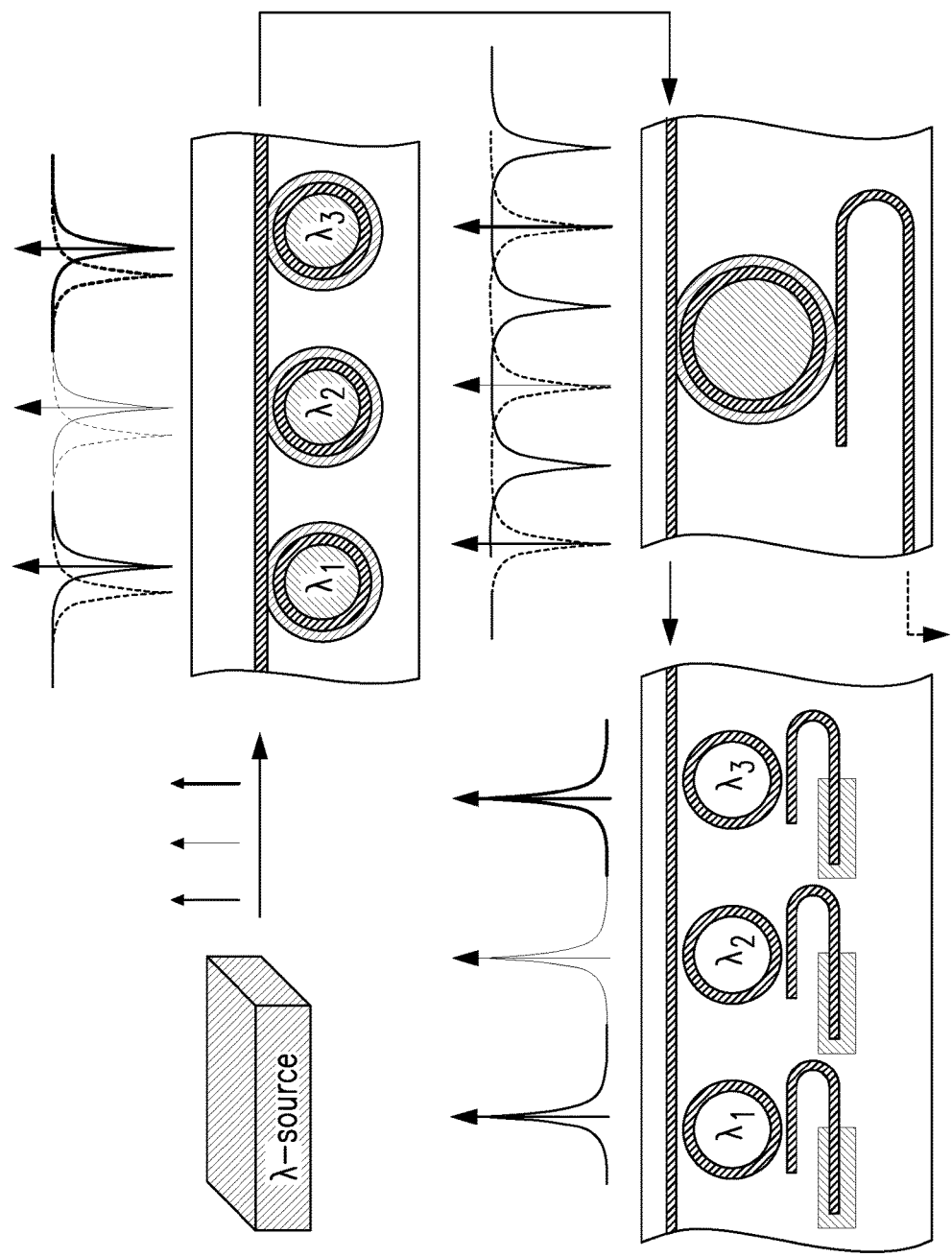
FIG. 1 shows an optical link composed of microring-based devices in which a wavelength source (λ-source) is modulated by multiplexed microring modulators.

FIG. 1 illustrates an optical link composed of microring-based devices. Microring resonators, which can also exist in a variant form as microdisk and microsphere resonators (physically similar and functionally identical), can be implemented in a variety of material systems. However, silicon is popular because of its compatibility with existing silicon microelectronics. The resonance characteristics of silicon microring resonators can be utilized to create optical modulators, filters, switches, and detectors that are ideal for wavelength-division-multiplexed (WDM) photonic links in future chip-scale interconnection networks.

However, for microring-based devices to work correctly their optical resonance needs to be aligned with the laser wavelength. Because of the tolerances of nanofabrication, it cannot be assured that the microring resonance will occur at the wavelength it is designed for. Hence, the laser wavelength should be able to dynamically lock the resonance of the microring. Wavelength locking can be done by using an integrated heater to thermally tune the microring resonance. In certain settings this is done manually, but in a commercial application there is a need for automation. Further, microring resonators can be susceptible to changes in temperature. Therefore, to counteract fluctuations in the ambient temperature, the integrated heater should dynamically tune the microring resonance.

The difficulty of locking the microring resonance to the laser wavelength can occur because of the symmetry of the microring resonance. Where the microring resonance is aligned with the minimum point of the resonance, it can be difficult to lock the microring resonance to the laser wavelength by measuring just the optical power transmission because the direction of the resonance drift is ambiguous in relation to the transmission of optical power. By wavelength locking the resonator and sampling the voltage applied to the heater during the wavelength locked state, a direct measurement of the resonance shift can be retrieved.

The disclosed subject matter provides for the use of a dithering signal to break the symmetry of the microring resonator and produce a corresponding error signal that can be used in a wavelength locking and stabilization system. The dithering signal can be produced by a variety of methods, including by using an integrated heater. The generated error-signal can provide for wavelength locking by allowing low-speed analog and digital circuitry to determine when the resonator and laser coincide in wavelength.

Figure 2:
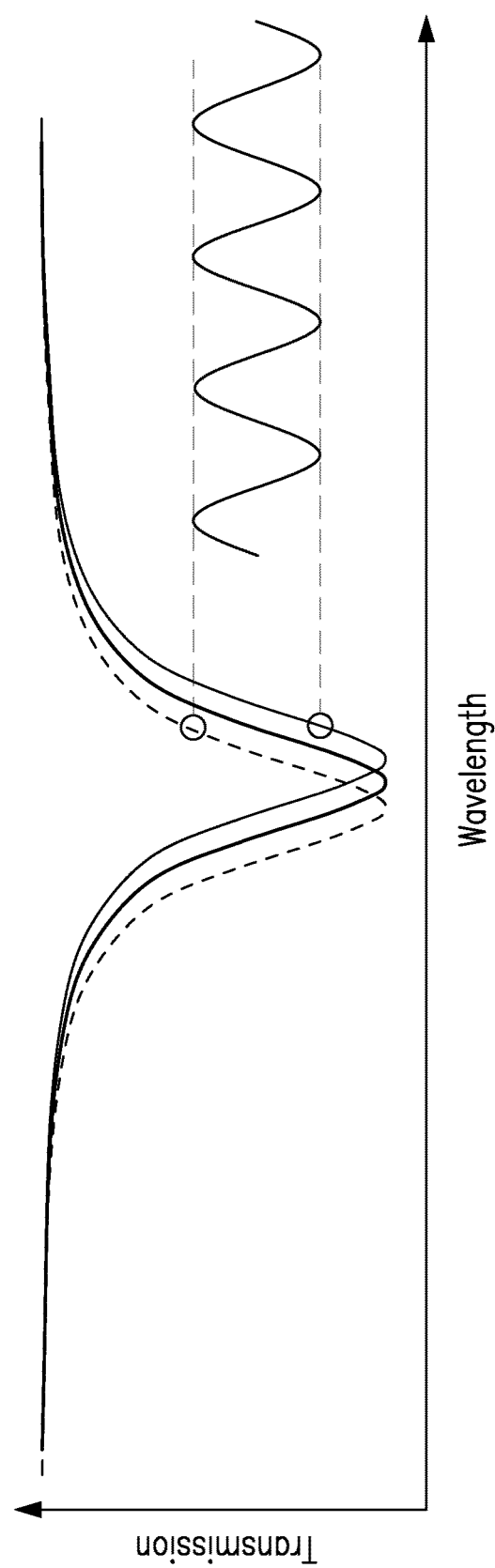
FIG. 2 shows how a small dither signal, applied thermally to the microring resonator, results in a small modulation of the optical signal.

FIG. 2 illustrates thermal dithering, whereby a small modulation is applied to the local temperature of the microring in order to produce a small modulation of the optical signal. The generated optical modulation will either be in- or out-of-phase with the driving signal, depending on which side of the resonance the laser wavelength is offset. By mixing the modulated optical signal with the driving dithering signal, this information can be recovered, as shown in (1), where, $f_D$ is the frequency of the dithering signal, and φ is the relative phase (0 or π) of the modulated optical signal.

$$\cos(f_D t) \otimes \cos(f_D t) + \phi) = \frac{1}{2}[\cos(2f_D t + \phi) + \cos(\phi)]. \quad (1)$$

The higher harmonic can be filtered, leaving the sign of the dc component {cos(φ) term} as an indication of the location of the resonance relative to the optical signal. The result is the desired anti-symmetric error signal, enabling the use of wavelength locking and stabilization.

Figure 3:
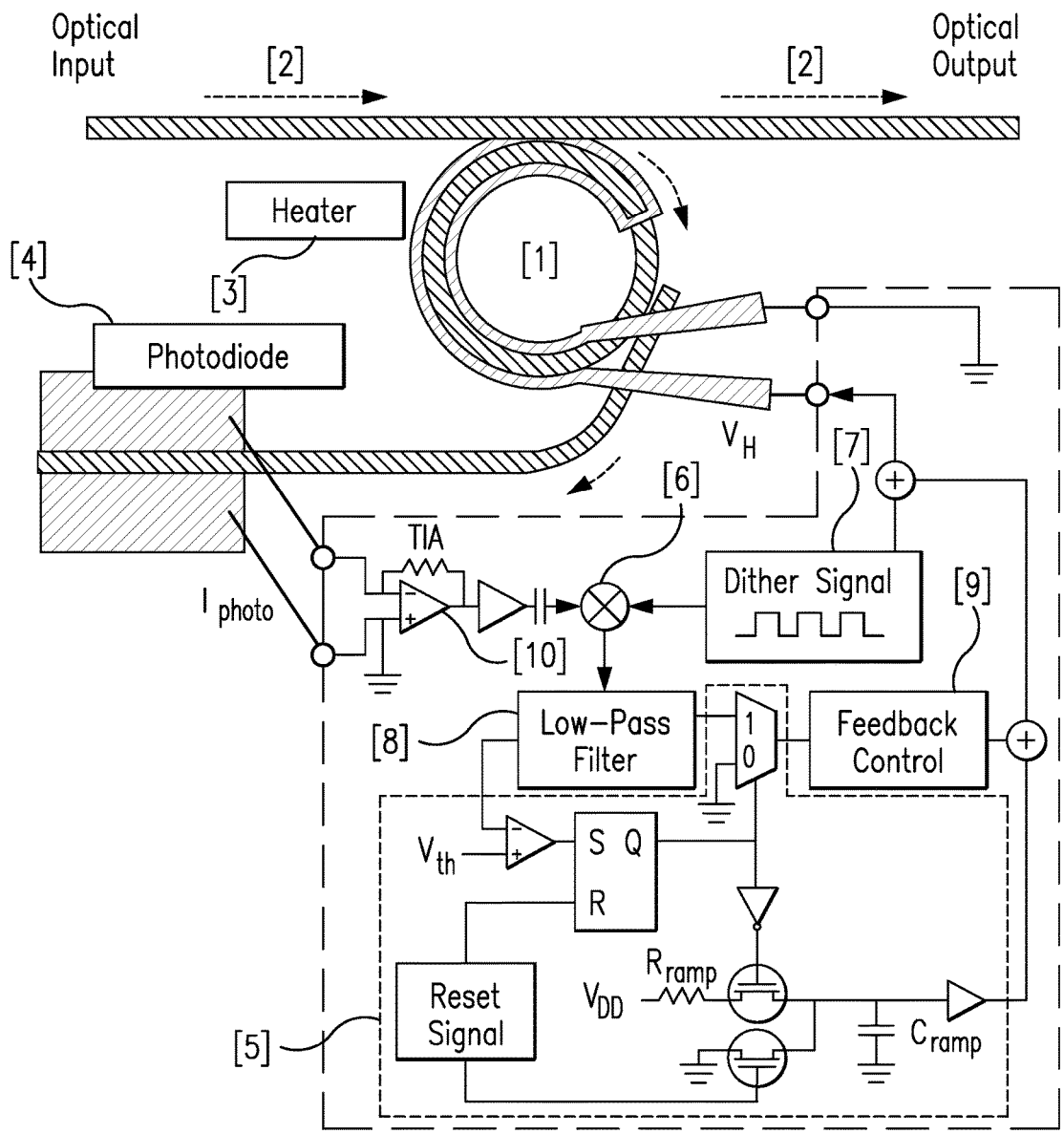
FIG. 3 is a schematic of the disclosed system. The off-chip electronics interfacing with the integrated photonic elements are shown in the dashed box. The wavelength locking circuitry is highlighted in box [5].

FIG. 3 shows an exemplary device according to the presently disclosed subject matter. The device includes a 15-μm radius silicon microring resonator [1] with grating couplers [2] for the optical input and output. A thin film titanium-based heater [3] is situated above the microring, separated from the microring by 1 µm of oxide. The drop port of the microring terminates in a defect-enhanced silicon photodiode [4], enabling the monitoring of the optical power dropped into the microring. However, it should be noted that a photodetector can be composed of any material, and can be situated on either output port of the microring.

Example off-chip electronics implementing the thermal dithering system are shown in the dashed box of FIG. 3. The electronics consist of low-speed (<20-MHz bandwidth) analog and digital ICs. A 1 kHz square-wave is used for the dithering signal [7]. The dithering signal should be at least an order of magnitude higher in frequency to successfully track thermal fluctuations in the ambient environment.

The optical signal, modulated by the thermal dithering, generates a photocurrent on the integrated silicon photodiode. The photocurrent is converted to a voltage using a trans-impedance amplifier (TIA) [10], and then furthered amplified. An analog multiplier IC [6] may be used to mix the amplified signal with the driving dithering signal [7]. A low pass RC filter [8] is used to suppress the AC component of the mixed product. A proportional-integral-derivative (PID) feedback controller [9] then uses the processed signal as an error signal to determine the drift of the microring and apply an appropriate correction to the heater.

The result is the generation of an anti-symmetric error signal that can then be used for the purpose of initializing (wavelength locking) and thermally stabilizing the microring resonator.

Figure 4A:
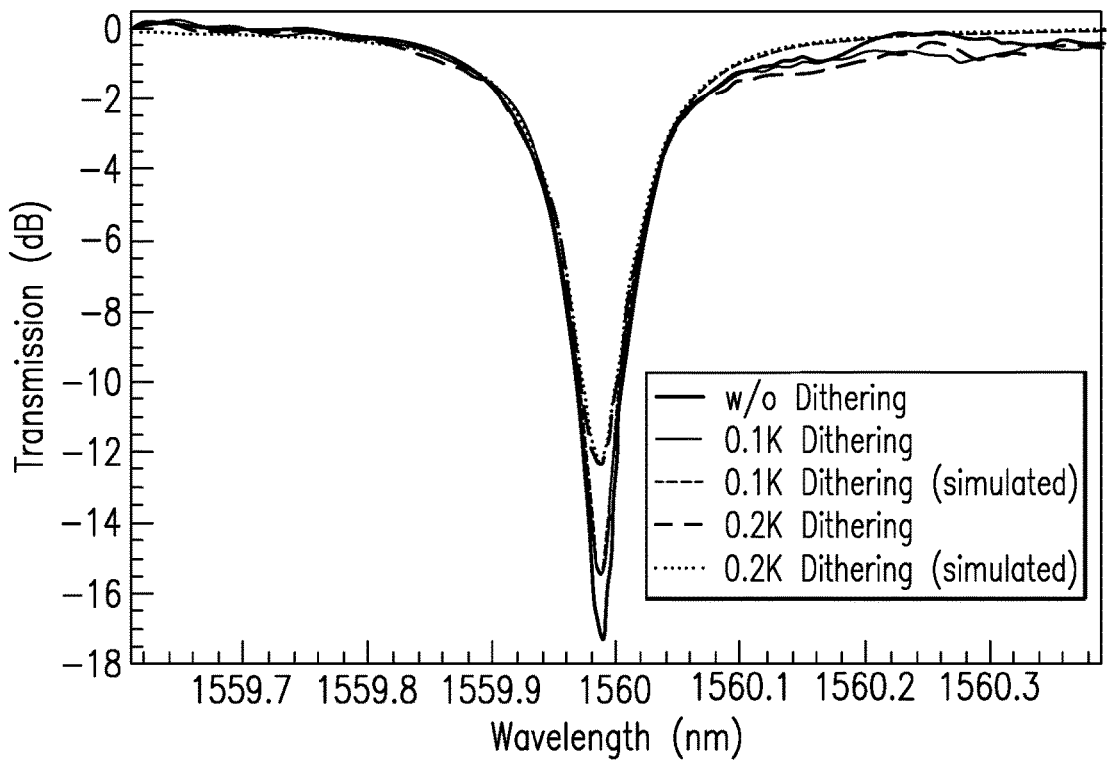
FIG. 4 shows microring resonance as it is subjected to thermal dithering signals of varying magnitude and the corresponding generated error signals.

The use of the thermal dithering signal can reduce the extinction ratio of the microring resonance. In FIG. 4(a), resonances of the microring resonator (Q of ~14,000) are plotted for square-wave thermal dithering signals of magnitude 0.1 K and 0.2 K. A larger thermal dither can result in a larger reduction of the extinction ratio. For thermal dithering of magnitude 0.1 K and 0.2 K the reduction in extinction ratio can be 1.9 dB & 4.8 dB, respectively.

While a larger thermal dither results in a larger reduction in extinction ratio, it has the advantage of producing a stronger error signal. FIG. 5(b) plots the simulated and measured waveforms of the error signal generated from mixing the dithering signal with the generated signal.

Figure 4B:
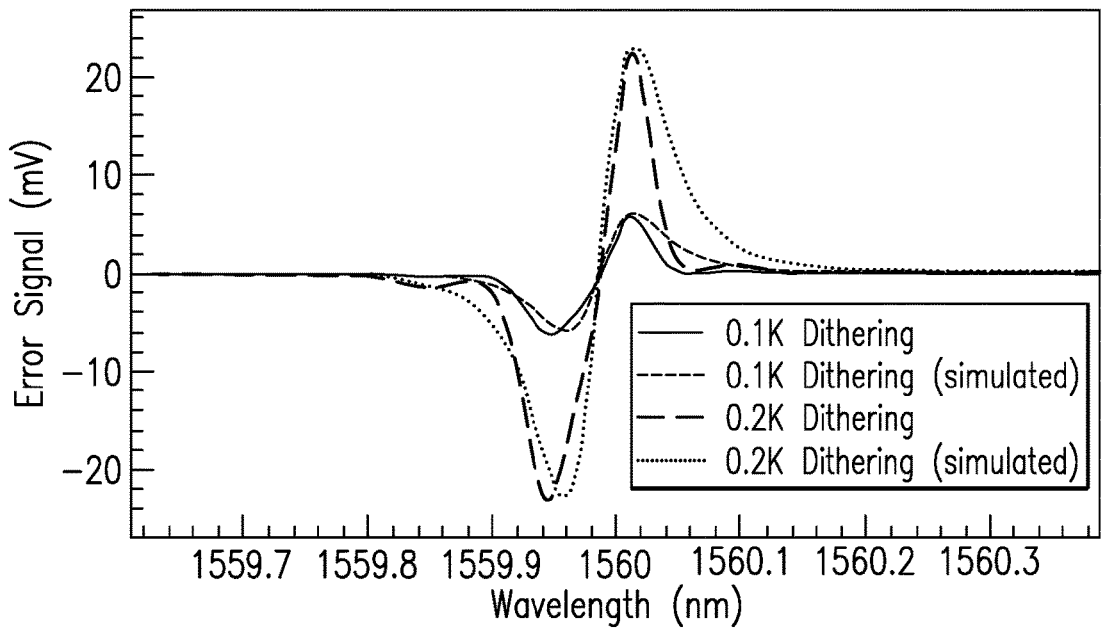

The anti-symmetric response of the error signal (see FIG. 4(b)) distinguishes between the red and blue sides of the microring resonance. Further, the zero crossing of the monotonic slope is located at the resonance minimum. Hence, a feedback system can stay locked to the zero crossing in order to lock the microring resonance with the laser wavelength.

While a larger error signal makes the system more robust against noise, a 0.1 K dithering signal can generate an error signal with a sufficient signal-to-noise ratio for locking and stabilizing the microring resonator.

Figure 5:
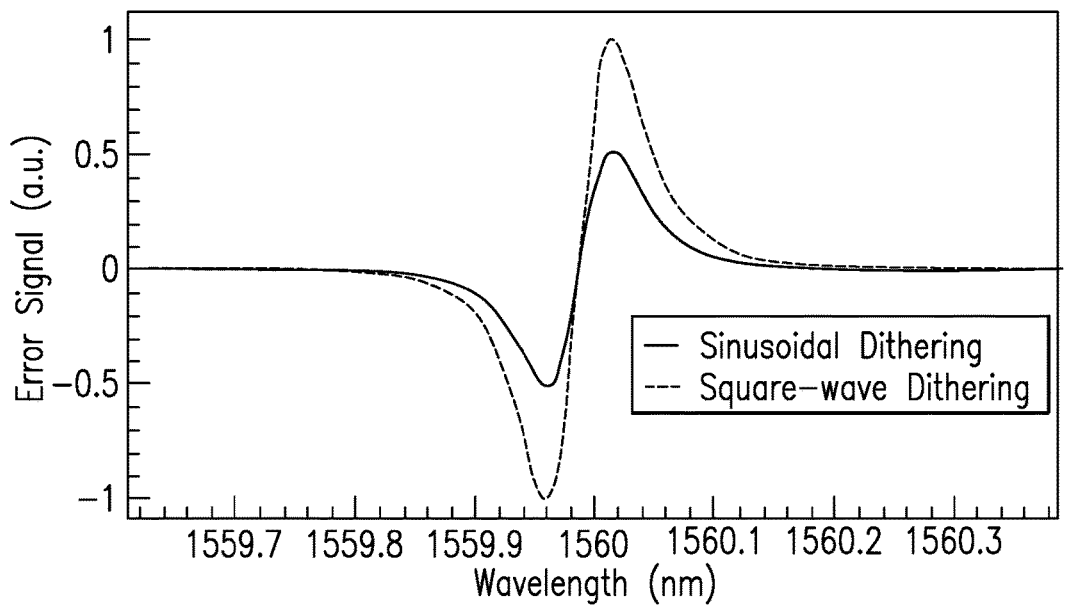
FIG. 5 contrasts simulations of the generated error signal with the use of a square-wave dithering signal versus the use of a sinusoidal dithering signal.

We utilized a square-wave dithering signal rather than the sinusoidal dithering signal. The dithering signal may be composed of any periodic waveform. However, the square-wave can be synthesized easily in electronic circuitry. Additionally, the mixed product of (ideal) square-waves can produce a pure dc component and none of the higher harmonic components that are eventually filtered. This has the consequence of producing a larger error signal for dithering signals of equivalent magnitude. FIG. 5 shows the graphs of generated error signals when using an ideal square-wave dithering signal versus using an ideal sinusoidal dithering signal. As can be seen from the graph, the square-wave dithering signal generates an error signal that is twice as large in magnitude.

An advantage of the generated error signal is that it is relatively immune to changes in the optical power of the signal. Certain microring-based optical networks can include optical paths that are reconfigurable as needed to address dynamic bandwidth allocation requirements. The insertion loss characteristics of optical paths will change as they are re-provisioned, yielding uncertainty in the optical power reaching any given microring resonator.

Figure 6:
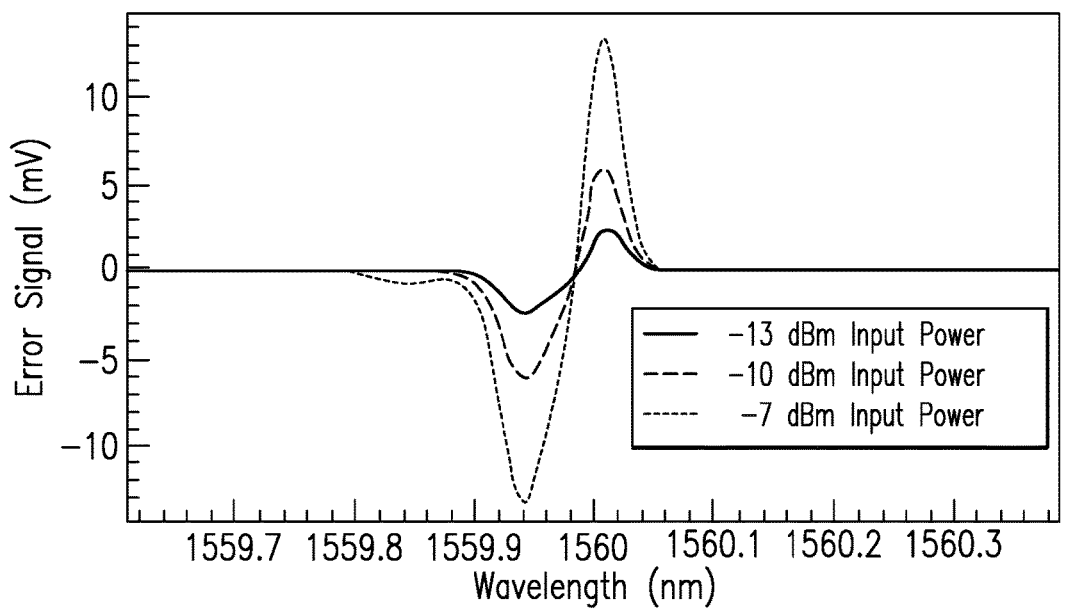
FIG. 6 illustrates the measured error signals when a 0.1 K thermal dithering is applied and the optical power of the laser into the chip is varied.

As FIG. 6 shows, the generated error signals can change in magnitude following variations in optical power. Additionally, the slope of the error signal can vary. However, a robust feedback controller (one that is able to contend with the change in slope of the error signal) can maintain the locking between the microring resonator and laser wavelength because the zero crossing of the error signal remains constant.

These error signals can be generated with a relatively weak optical signal reaching the photodetector. The fiber-to-fiber coupling loss of the chip can be ~20 dB. Given symmetric coupler and waveguide losses, the power reaching the photodetector for the measured error signals shown in FIG. 6 can be less than −20 dBm. This figure covers the low optical powers that can be present in a silicon photonic link in view of the sensitivity limit of photodetectors.

Figure 7:
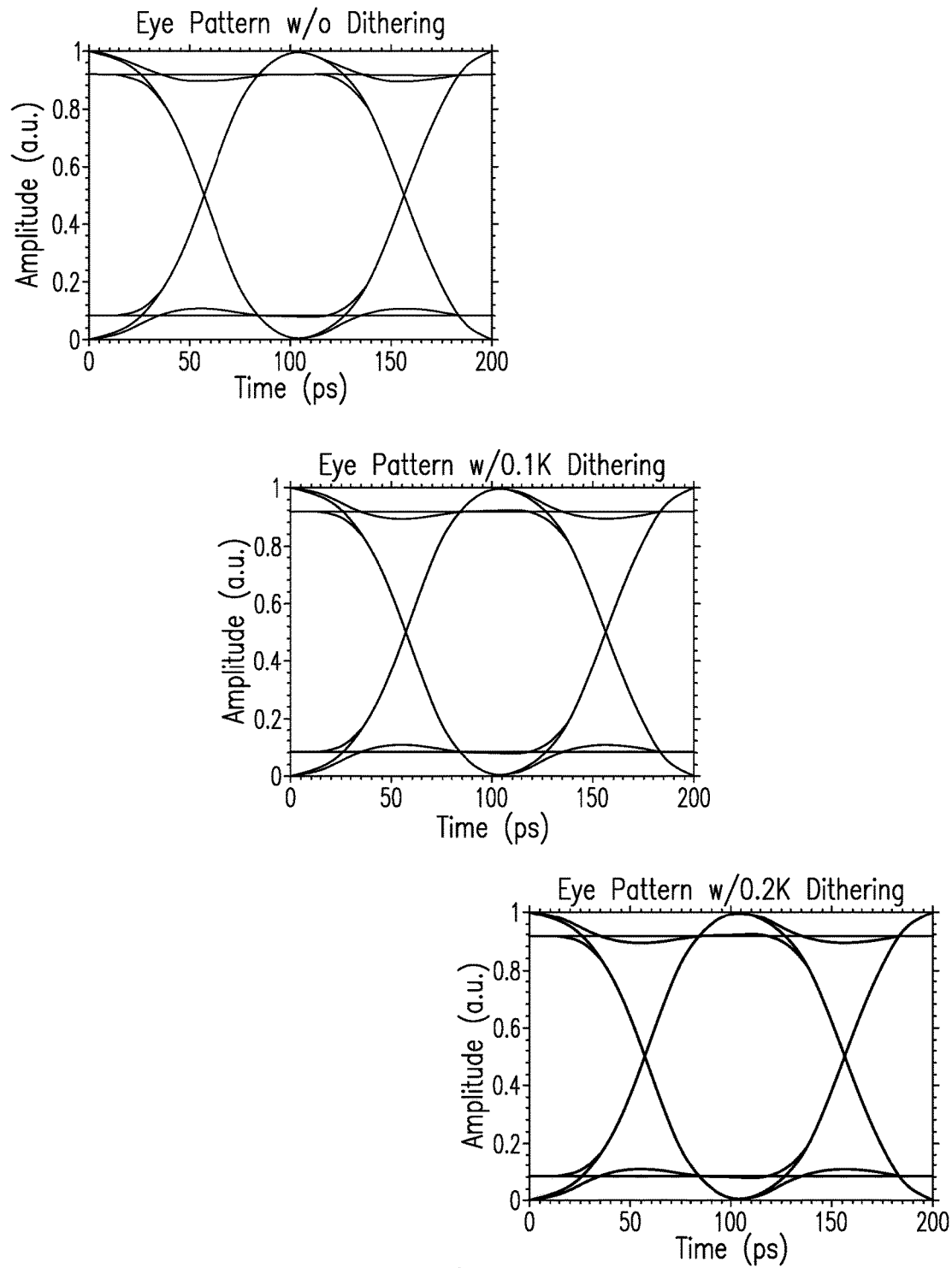
FIG. 7 simulates the eye pattern of a 10 Gb/s optical signal propagating through a microring with no dithering (left), and dithering of magnitudes 0.1 K (middle) and 0.2 K (right).

For use in data applications, the dithering of the microring resonance should not negatively impact the integrity of the optical data signals. For testing, 10 Gb/s optical data signals were routed from the input port, through the microring, and into the drop port of a dithered microring resonator (a microring in the de-multiplexing configuration). FIG. 7 shows the eye patterns of the received signal when a dithering signal of a magnitude of 0.1 and 0.2 K was applied to the microring, as well as when no dithering signal was applied (as stated before, a 0.1 K dithering magnitude can be sufficient for locking and thermally stabilizing the microring resonator). See FIG. 4(a).

As evidenced by the eye patterns, dithering has the effect of broadening only the '1' level of the optical signal. However, this broadening is minimal, resulting in eye closures of only 0.3% and 1.6% when using dithering signals of 0.1 and 0.2 K, respectively. For small deterministic eye closures such as this, the power penalties can be directly correlated as being 0.01 and 0.07 dB, respectively. Power penalties of this magnitude are well within the optical link budgets for microring-based links, and hence will not impede the use of the dithering technique for data applications.

The error signal generated from a modulated signal can be smaller than the error signal generated from an unmodulated signal. This is due to the broadened spectrum of the modulated signal. For example, the error signal generated from a 10-Gbps NRZ signal can be 20% smaller than an error signal generated from an unmodulated signal (when using a microring resonator with the prior discussed parameters).

One application of the generated error signal is in the process of tuning the microring resonator such that it is aligned in resonant wavelength with the laser source. Denoted as wavelength locking, this is a critical functionality for any given microring-based platform as the lasers and microring resonators will be initially offset in wavelength due to fabrication tolerances or changes in the ambient temperature.

Figure 8:
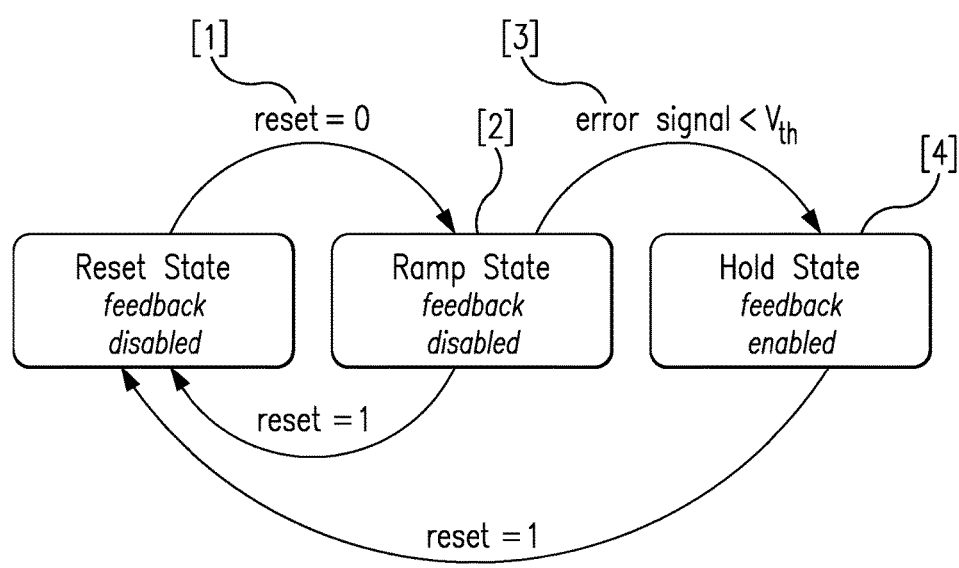
FIG. 8 is a state diagram describing the functionality of the wavelength locking circuitry.

The electronic circuitry devoted to the wavelength locking process is detailed in FIG. 3 (outlined by box [5]). The functionality of this circuitry is shown in the state diagram of FIG. 8. A reset signal [1] can be used to trigger the ramping of the voltage [2] applied to the integrated heater. As the microring is tuned to the laser wavelength the error signal [3] will trip the system into the hold state [4], in which the feedback controller is activated and the microring is locked and stabilized against further drifts in temperature or laser wavelength. Additional logic can be added to reset and re-attempt the wavelength locking should it fail on its initial attempt.

Figure 9:
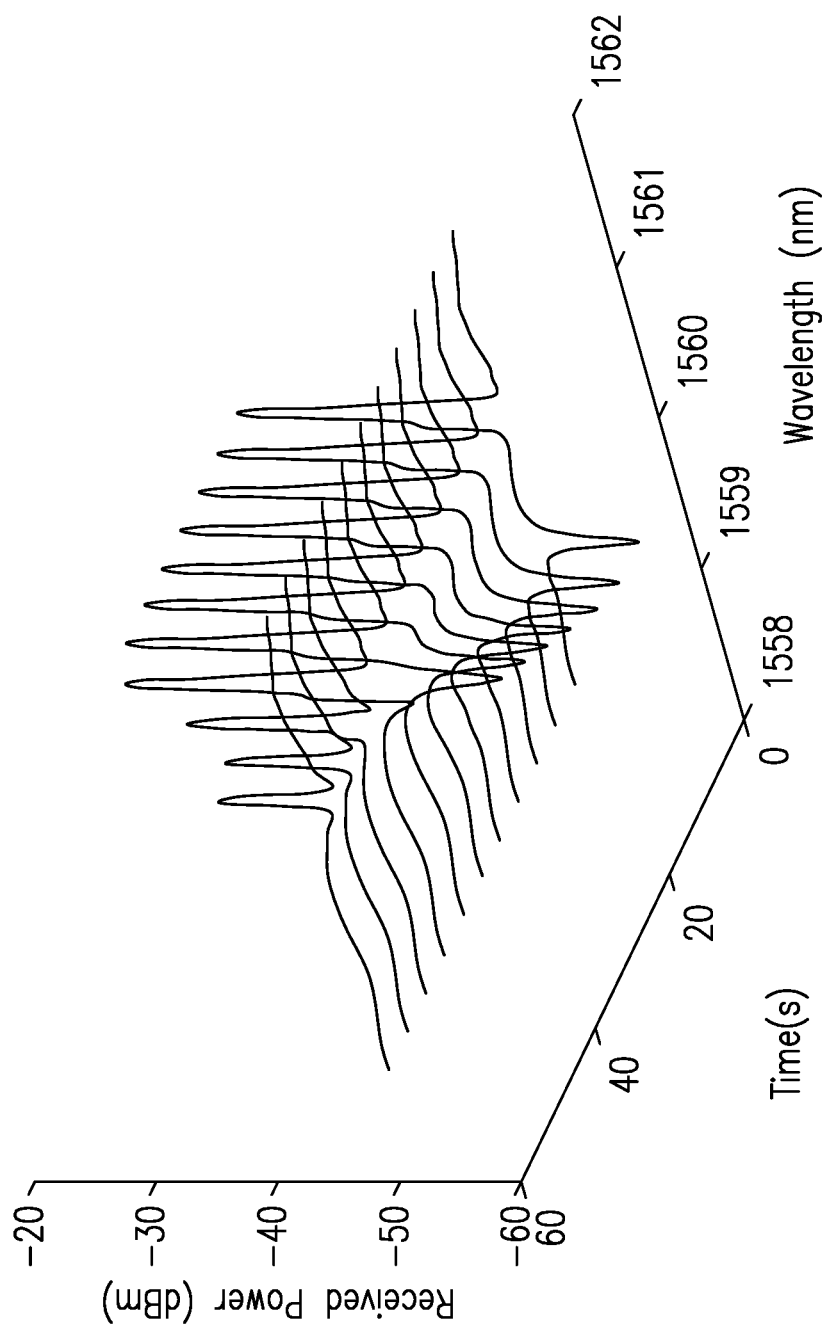
FIG. 9 shows optical traces of the microring resonance being tuned and wavelength locked to a laser source.

The optical spectrum analyzer traces in FIG. 9 demonstrate the system locking a microring resonator to a laser (an ASE source is used to background image the microring's resonance). Initially, the microring resonance is at ~1559.2 nm, and the laser is offset at ~1560 nm. Over the course of 50 s, the microring is tuned higher in wavelength until the control system detects the error signal and establishes the lock. To record the optical traces of FIG. 9, the ramp speed (rate at which the tuning occurs) of the system was reduced, such that the wavelength locking can occur over the course of seconds.

Figure 10:
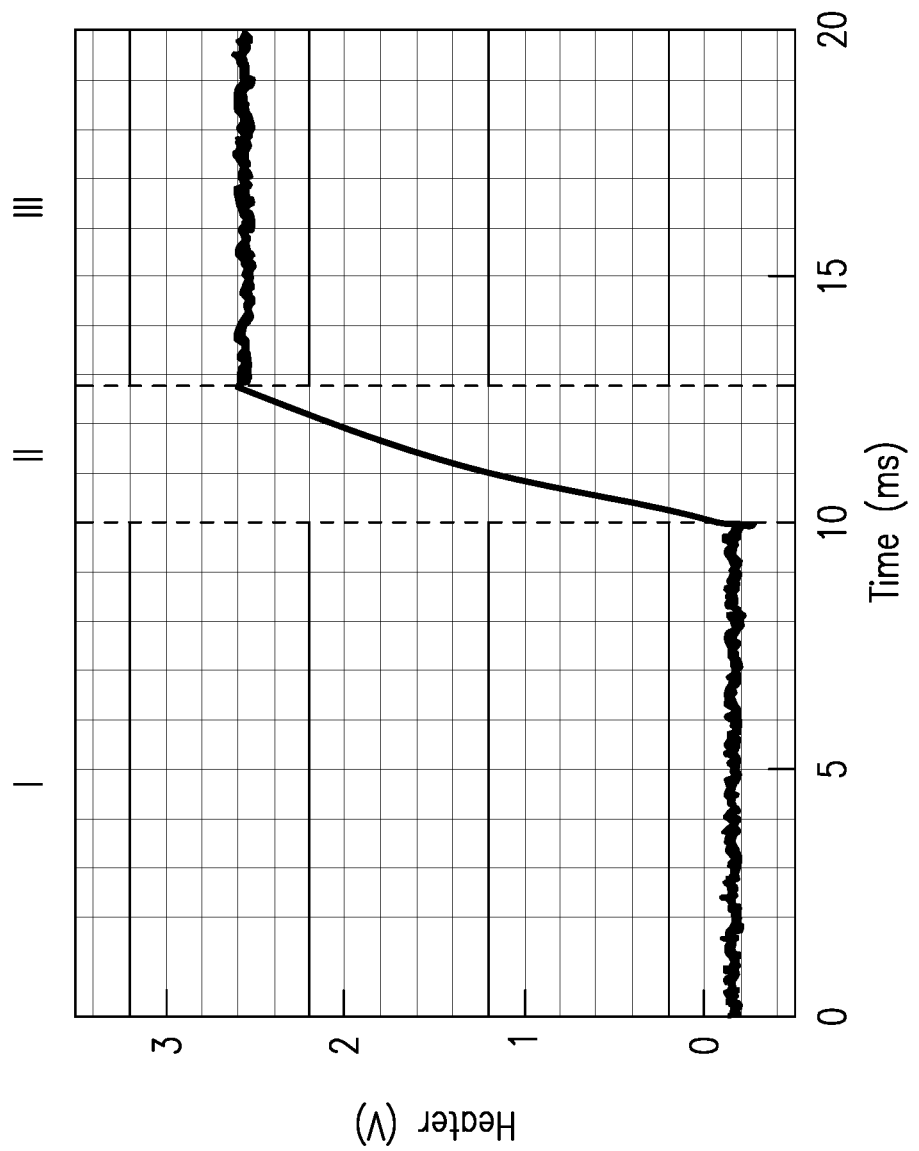
FIG. 10 is an oscilloscope trace of the heater voltage as the microring is wavelength locked to the laser source showing the reset state (I), ramp state (II), and hold state (III).

FIG. 10 shows an oscilloscope measurement of the heater voltage during the wavelength locking process. Here, the ramp speed is decreased to allow locking in the ~ms range. The graph of FIG. 10 has been annotated with the stages of the state machine, with the period (I) designating the heater voltage while the system is in the reset state, (II) designating the period in which the voltage is ramped, and (III) designating the wavelength-locked hold state, which occurs once the microring resonator and wavelength become aligned.

The wavelength locking method we have demonstrated serves as an effective means to initialize the microring-based photonic link. Once the link has been initialized, it is necessary to guard it against thermal fluctuations. Conventionally, to maintain the local temperature of the microring, the heat generated by the integrated heater is increased or decreased in response to decreases or increases in the ambient temperature. To implement this, the thermal dithering system can be cascaded with a feedback system (as schematized in FIG. 3) to thermally stabilize the microring resonator.

Figure 11:
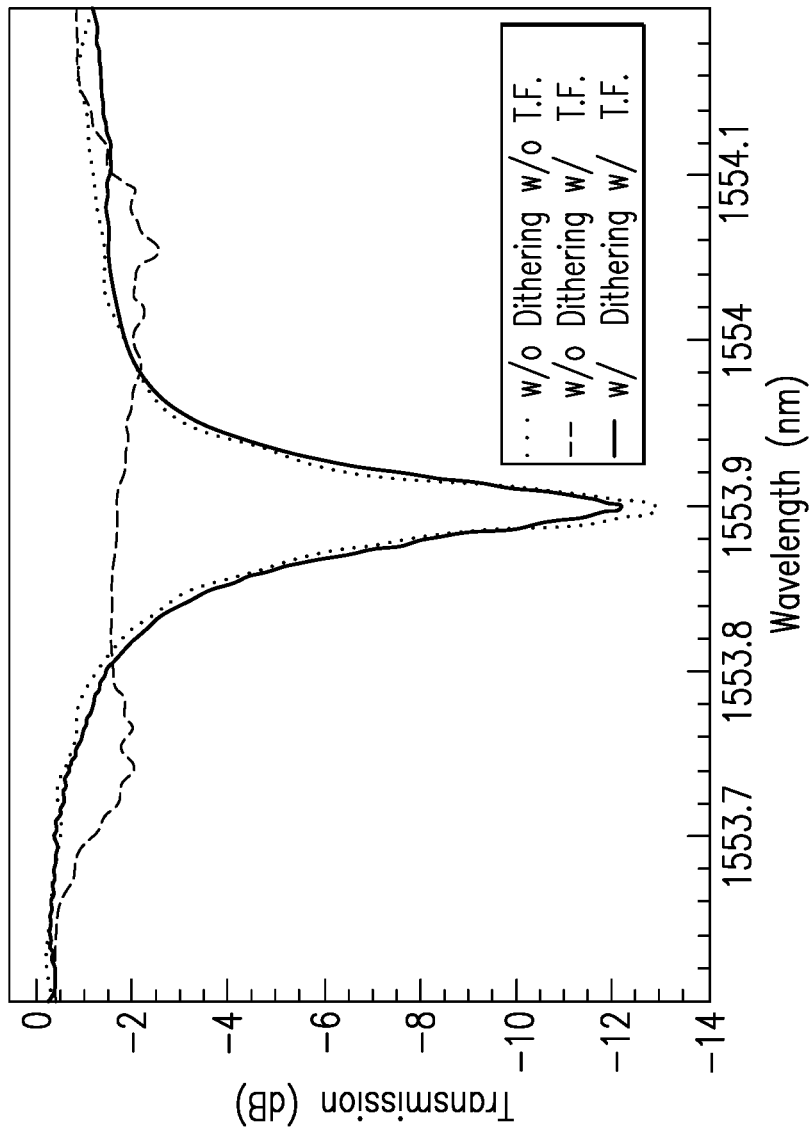
FIG. 11 shows microring resonance when subjected to thermal fluctuations (T.F.), with and without the dithering and feedback system implemented. Also shown for comparison is the resonance without the stabilization system under normal, thermally stable conditions.
Figure 12:
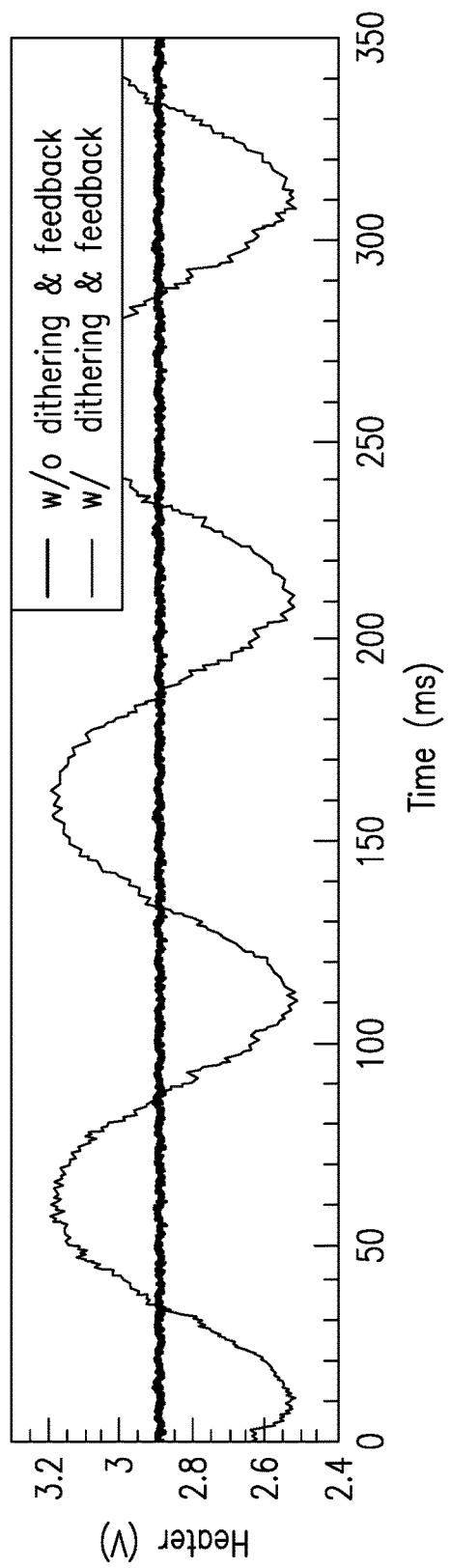
FIG. 12 illustrates heater voltage when the microring resonator is being exposed to thermal fluctuations and, with and without, the dithering system actively counteracting said thermal fluctuations.

In order to verify the thermal stabilization, wavelength scans were performed of a resonance adjacent in wavelength to the resonance that the thermal dithering and feedback system was locked to (see FIG. 11). FIG. 11 shows the thermal dithering and feedback system, the microring resonance stays locked to the laser wavelength, with the dynamic tuning of the heater counteracting the thermal fluctuations inflicted on the microring (see FIG. 12). In contrast, without thermal stabilization, the resonance fluctuates severely, being washed out in the wavelength scan (see FIG. 11).

Figure 13:
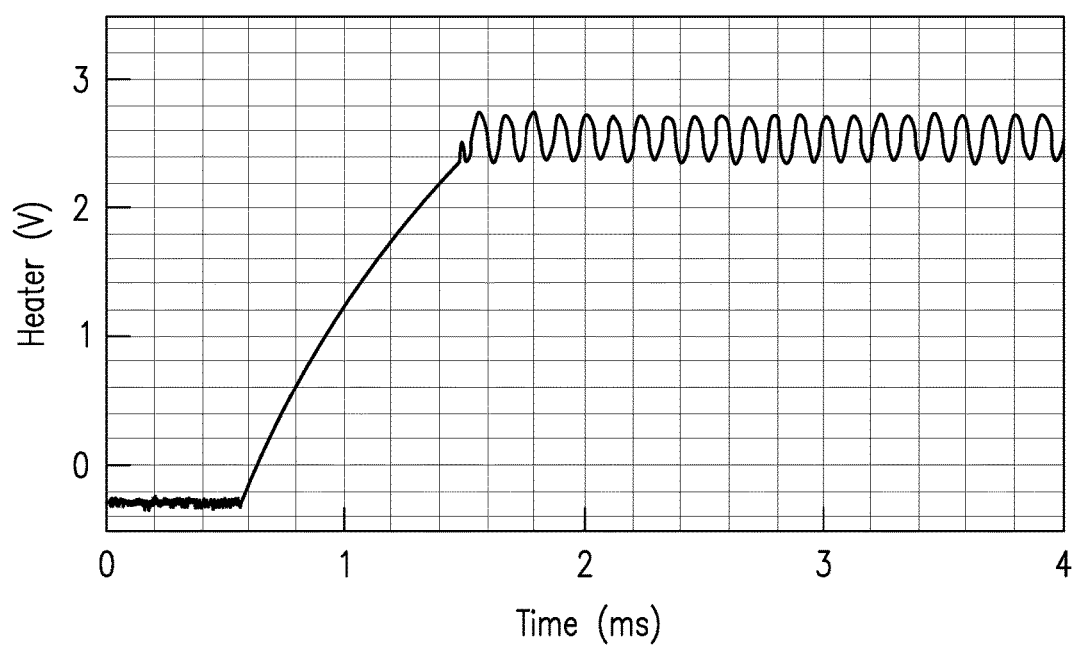
FIG. 13 shows heater voltage as the microring resonator is wavelength locked while being subjected to sinusoidal thermal fluctuations.

This thermal stabilization method is robust enough that wavelength locking can occur even in thermally volatile environments. To demonstrate this, the microring resonator was wavelength locked while the microring resonator was subjected to sinusoidal thermal fluctuations. FIG. 13 shows the heater voltage during this process. When the microring resonator is wavelength locked, the system immediately begins the thermal stabilization mechanism (as evidenced by the sinusoidal counter-tuning of the heater voltage in FIG. 13).

For the demonstrated control system to be adapted for commercial microring-based links it must be scalable. Scalability requires meeting two criteria, the first being that the control system is sufficiently low-power such that the aggregate power consumption of initializing and stabilizing all the microring resonators in the optical link does not exceed the power efficiency improvement gained by the use of microring resonators. Second, the mechanisms in the control system must be compatible with the typical WDM configuration of microring resonators, in which they are cascaded along a common waveguide bus.

To estimate the power consumption we tabulated the active components of the control circuitry (see FIG. 3), referencing established power consumption figures when these components are implemented in conservative CMOS technology. The majority of the circuitry devoted to wavelength locking (see FIG. 3) includes digital logic elements that draw power when switching logic states. Under the assumption that the optical link's operating time will be much longer than the initialization period, the power consumption of these elements is negligible. The feedback control can be decomposed into 4 op-amps, with the TIA, unity buffer, and summers contributing another 4 op-amps, for a total of 8 op-amps. Op-amps with the required ~MHz bandwidth characteristics have routinely been implemented in CMOS technology with power consumptions as low as 40 μW.

The dithering signal can be implemented using an oscillator, with an example oscillator covering the required sub-MHz to few-MHz range while exhibiting power consumptions as low as 20 μW. Lastly, analog multipliers are also routinely implemented in CMOS technology, with a conservative example having a power consumption of 45 μW. The aggregate power consumption of the control circuitry can then be estimated to be 385 μW. To express this in the popular fJ/bit metric, the microring resonator can be assumed to operate on a 10 Gb/s data signal, yielding a power consumption of 38.5 fJ/bit for the control circuitry. This estimate falls well within strict pJ/bit power budgets.

When evaluating the power consumption of this solution, the power consumption of the integrated heater should also be taken into consideration. However, this power consumption can be treated independently of the control circuitry, and will be a function of the heater efficiency, required tuning distance, and variation in temperature.

When considering the other important criteria, that the control method is compatible with WDM implementation, there are no inherent features of the dithering technique that precludes the use of WDM. The dithering is a process local to the microring resonator and does not affect adjacent cascaded microring resonators. Additionally, by using different dithering frequencies for different microring resonators, the orthogonality principle can be leveraged:

$$\int \cos(f_n t)\cos(f_m t)dt = 0, f_n \neq f_m. \tag{2}$$

This feature can eliminate crosstalk in error signals even when microring resonators overlap in the spectral regime. Hence, WDM implementation can be readily achieved, with each microring resonator in the cascaded array initializing and stabilizing independently.

The Fourier representation of a normalized $2\pi$-periodic ideal square wave is given in (3)

$$f(t, \phi) = \frac{4}{\pi} \sum_{n=1,3,5...}^{\infty} \frac{\sin(nt + \phi)}{n}. \tag{3}$$

When the generated optical modulation is in-phase with the driving dithering signal, the product is given as (4)

$$f(t, 0)f(t, 0) = \frac{16}{\pi^2} \left( \sum_{n=1,3,5...}^{\infty} \frac{\sin(nt)}{n} \right) \left( \sum_{n=1,3,5...}^{\infty} \frac{\sin(nt)}{n} \right). \tag{4}$$

The DC component is given as the integral of (4). Using the orthogonality principle (2), the cross-terms can be eliminated, leaving the non-zero terms in given in (5)

$$\int f(t,0)f(t,0)dt = \frac{16}{\pi^2}\int \sum_{n=1,3,5...}^{\infty} \frac{\sin^2(nt)}{n^2}dt \quad (5)$$

$$= \frac{16}{\pi^2}\left(\frac{1}{2}\right)\sum_{n=1,3,5...}^{\infty}\frac{1}{n^2}$$

$$= \frac{16}{\pi^2}\left(\frac{1}{2}\right)\left(\frac{\pi^2}{8}\right) = 1$$

where the infinite summation has been solved as a modified Basel series. Similarly, when the generated optical modulation is out-of-phase with the driving dithering signal, the product and dc component are given as (6) and (7), respectively, $$f(t,0)f(t,\pi) = \frac{16}{\pi^2}\left(\sum_{n=1,3,5...}^{\infty}\frac{\sin(nt)}{n}\right)\times\left(\sum_{n=1,3,5...}^{\infty}\frac{\sin(nt+\pi)}{n}\right) \quad (6)$$

$$\int f(t,0)f(t,\pi)dt = -\frac{16}{\pi^2}\int\sum_{n=1,3,5...}^{\infty}\frac{\sin^2(nt)}{n^2}dt = -1. \quad (7)$$

Hence, the dc component takes on a value of $\{1,-1\}$, in comparison to using normalized sinusoidal waves, in which the dc components have values of $\{\frac{1}{2}, -\frac{1}{2}\}$.

The described system effectively initializes and thermally stabilizes individual microring resonators while tolerating thermal fluctuations of a magnitude greater than 5 K. There are no inherent limitations on the voltages supplied by the control circuitry, and integrated heaters can have very large temperature tuning ranges sufficient to cover the temperature variations in envisioned applications. For instance, within a datacenter rack, the projected temperature variation is at most 20 K.

In addition to the specific embodiments claimed below, the application is also directed to other embodiments having any other combination of the dependent features claimed below and those disclosed above. As such, the particular features presented in the dependent claims and disclosed above can be combined with each other in other manners within the scope of the application such that the application should be recognized as also specifically directed to other embodiments having any other combinations. Thus, the foregoing description of specific embodiments of the application has been presented for purposes of illustration and description. It is not intended to be exhaustive or to limit the application to those embodiments disclosed.

The invention claimed is:

1. A method for automatically tuning a coupled resonator to match a wavelength of electromagnetic radiation emitted from an applied laser source, comprising:
   applying a variable voltage to an integrated heater coupled to the coupled resonator;
   applying, by an electronic circuit, a dithering signal to the coupled resonator;
   measuring a modulated optical signal generated in response to the dithering signal;
   mixing the dithering signal and the modulated optical signal;
   filtering the mixed signal to obtain an error signal; and
   tuning the coupled resonator to match the wavelength based at least in part on the error signal,
   wherein the variable voltage applied to the integrated heater is triggered by a reset signal indicating the coupled resonator requires tuning.

2. The method of claim 1, wherein the applying the dithering signal comprises generating a periodic waveform.

3. The method of claim 1, wherein the applying the dithering signal comprises applying a modulation to a local temperature of the coupled resonator.

4. The method of claim 1, wherein the measuring of the modulated optical signal comprises:
   receiving a photocurrent on a photodiode; and
   converting the photocurrent to a voltage.

5. The method of claim 4, further comprising amplifying the voltage.

6. The method of claim 1, wherein the mixing comprises electrically mixing the dithering signal and a voltage based on the modulated optical signal.

7. The method of claim 1, wherein the tuning of the coupled resonator comprises:
   determining, based on the error signal, a drift of the coupled resonator; and
   applying a correction.

8. The method of claim 1, wherein the coupled resonator comprises a microring resonator.

9. A system for automatically matching a wavelength of electromagnetic radiation emitted from an applied laser source, comprising:
   a coupled resonator, adapted to be optically coupled to the laser source;
   an integrated heater, coupled to the coupled resonator, and configured to receive a variable voltage; and
   an electronic circuit, coupled to the coupled resonator, and configured to:
      apply a dithering signal to the coupled resonator;
      measure a modulated optical signal generated in response to the dithering signal;
      mix the dithering signal and the modulated optical signal;
      filter the mixed signal to obtain an error signal; and
      tune the coupled resonator to match the wavelength based at least in part on the error signal wherein the variable voltage applied to the integrated heater is triggered by a reset signal indicating the coupled resonator requires tuning.

10. The system of claim 9, wherein the electronic circuit comprises a photodiode coupled to the coupled resonator.

11. The system of claim 10, wherein the electronic circuit further comprises a transimpedance amplifier coupled to the photodiode.

12. The system of claim 9, wherein the electronic circuit comprises an analog mixer.

13. The system of claim 9, wherein the electronic circuit comprises a feedback controller.

14. The system of claim 13, wherein the feedback controller comprises a proportional-integral-derivative feedback controller.

15. The system of claim 13, wherein the feedback controller comprises a proportional-integral feedback controller.

16. The system of claim 9, wherein the electronic circuit comprises a waveform generator.

17. The system of claim 9, wherein the coupled resonator comprises at least one of lithium-niobate, indium phosphide, silica, and silicon nitride.

18. The system of claim 9, wherein the coupled resonator comprises a silicon resonator.

19. The system of claim 9, wherein the integrated heater comprises a resistive material.

20. The system of claim 19, wherein the resistive material comprises at least one of titanium, nichrome, nickel, chromium, and poly-silicon.

21. The system of claim 9, wherein the coupled resonator comprises a silicon microring.

22. The system of claim 9, wherein the integrated heater comprises a thin film titanium-based heater.

23. The system of claim 9, wherein the coupled resonator is separated from the integrated heater by an oxide layer.

24. The system of claim 9, wherein the coupled resonator is co-located on a same layer as the integrated heater.

25. The system of claim 9, further comprising grating couplers for an optical input and an optical output.

26. The system of claim 9, further comprising tapered waveguides for lateral optical coupling.

27. The system of claim 9, further comprising one or more mode converters for lateral optical coupling.

28. The system of claim 9, wherein the coupled resonator comprises a microring resonator.

* * * * *